United States Patent [19]

Millhollan et al.

[11] 4,075,609
[45] Feb. 21, 1978

[54] ON-CHIP VOLTAGE SOURCE FOR INTEGRATED CIRCUITS

[75] Inventors: Michael Scott Millhollan; Robert Michael Reinschmidt, both of Sunnyvale, Calif.

[73] Assignee: Motorola, Inc., Schaumburg, Ill.

[21] Appl. No.: 681,298

[22] Filed: Apr. 29, 1976

[51] Int. Cl.² ............................................. G11C 11/40
[52] U.S. Cl. ................................. 365/154; 357/40; 365/205; 365/207; 365/210
[58] Field of Search ............................ 357/40, 45, 51; 340/173 R, 173 FF

[56] References Cited
U.S. PATENT DOCUMENTS

| | | | |
|---|---|---|---|
| 3,855,483 | 12/1974 | Kays et al. | 340/173 AD |
| 3,909,631 | 9/1975 | Kitagawa | 340/173 AD |

*Primary Examiner*—Terrell W. Fears
*Attorney, Agent, or Firm*—Joe E. Barbee

[57] ABSTRACT

An on-chip reference voltage source is coupled to an on-chip integrated circuit such as a memory cell. The reference voltage is compared against internal signals generated by the on-chip integrated circuit in order to develop an output voltage representing the state of the integrated circuit. In memory applications the memory reference signal constitutes a threshold voltage which is compared against the internal voltage logic swing generated by one half of the memory cell for providing output signals indicative of the state of the memory cell. Selecting the impedance of the reference voltage source and the integrated circuit (one half the cell in memory applications) to be identical from an electrical and device standpoint allows lower threshold noise levels to be used despite the existence of process, impedance (AC and DC), temperature and input signal variations. This permits power savings, and increased densities.

8 Claims, 5 Drawing Figures

4,075,609

ON-CHIP VOLTAGE SOURCE FOR INTEGRATED CIRCUITS

BACKGROUND OF THE INVENTION

Numerous on-chip voltage generating sources have been suggested for both memory and logic applications where the on-chip voltage source is used to generate a reference voltage which is compared against the voltage signal swing internally generated by the memory or logic circuit. These known prior art on-chip circuits essentially operate under the principle that supply and temperature induced voltage variations across the base to emitter junctions of the transistors located in both the integrated circuit and the reference or threshold voltage source can be made to track with each other and thus result in a substantially constant output signal when compared against each other.

However, these prior art techniques still are susceptible to certain types of process and electrical variations between the on-chip integrated circuit and its on-chip voltage source. Due to these variations it is difficult to insure that the threshold or reference voltage is maintained exactly intermediate to the signal swing associated with the logic or memory circuit. This limitation necessitated that noise tolerance threshold levels be increased in order to assure the generation of error free output signals from the integrated circuit. An increase in the noise threshold level increases power requirements, reduces densities and decreases operating speeds.

It is therefore an object of the present invention to provide an on-chip integrated circuit and an on-chip voltage reference or threshold source that operate at faster speeds, lower power, higher densities and lower noise threshold levels.

Another object of the present invention is to provide an integrated circuit capable of operating at reduced noise threshold levels and which is less sensitive to process variations such as beta, sheet resistivity and mask alignments and to electrical variations such as input signal changes.

A further object of the present invention is to provide an on-chip integrated circuit and associated on-chip voltage reference or threshold circuit which is capable of operating at lower noise threshold levels despite AC and DC impedance variations.

SUMMARY OF THE INVENTION

The present invention allows the noise threshold level of an integrated circuit and interconnected reference or threshold voltage circuit disposed on the same semiconductor substrate to be reduced thus reducing power dissipation and silicon area by employing a voltage generating circuit having substantially identical electrical AC and DC impedance and device characteristics as the equivalent integrated circuit which is generating the logic or memory signal. In a memory cell embodiment the voltage generating circuit is constituted by a circuit having device configuration identical to a portion of the conductive half memory cell.

DESCRIPTION OF THE PREFERRED EMBODIMENTS

Figure 1:
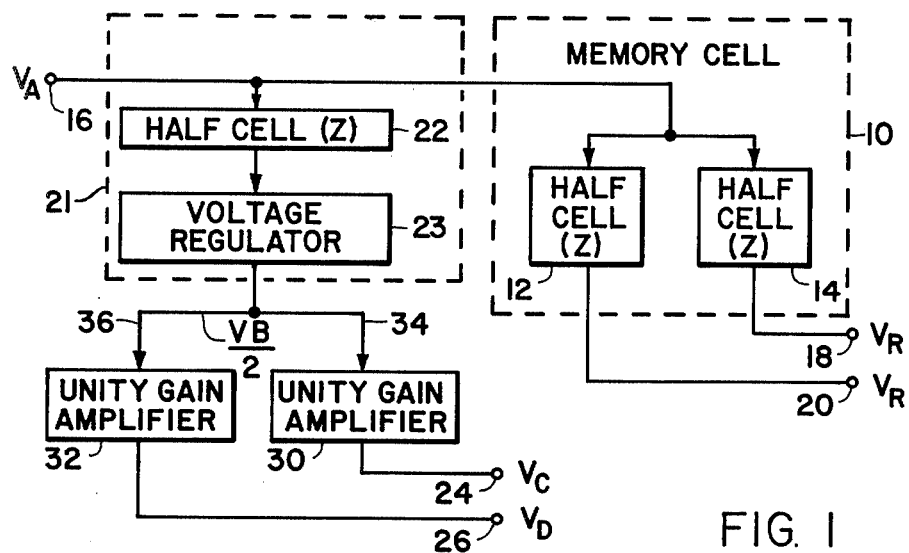
FIGS. 1 and 2 show respectively an electrical block diagram and a schematic diagram illustrating the present invention.

As known, on-chip voltage regulating circuits normally are coupled to logic or memory circuits and the voltages which they generate are used as threshold or reference voltages to be compared against the voltages generated by the on-chip logic or memory circuit. The present preferred embodiment is depicted as a memory circuit but it is equally applicable to logic circuit implementations. In either case, an integrated circuit 10 comprising a memory cell having a pair of half cells 12 and 14 is responsive to an input signal $V_A$ received at input terminal 16 in order to generate a pair of output voltages $V_R$ on output terminals 18 and 20. A voltage generating and translating circuit 21 including a half cell circuit 22 and a voltage translator 23 is also responsive to the input signal $V_A$ in order to generate a pair of threshold output voltages $V_C$ and $V_D$ on output terminals 24 and 26. A pair of unity gain amplifiers 30 and 32 are coupled between the output terminals 24 and 26 and the half cell voltage generating and translating circuit 21 by means of lines 34 and 36.

In the memory circuit application a voltage ($V_B/2$) is generated on lines 36 and 34 and constitutes a threshold voltage residing midway between the logic signal swing of output signals $V_R$. The output voltages $V_C$ and $V_D$ threshold voltage levels which are each respectively compared against their associated $V_R$ voltage in order to generate an output voltage to be sensed by a suitable amplifier circuit (shown in FIG. 2) as is well known in the art.

As the impedance (Z) of the half cell 22 is selected to be substantially identical from a circuit and device standpoint to that of each memory half cell, i.e., the impedance of either conductive half cell 12 or 14 is also Z during a read operation, it results that $V_R = V_B$; $V_C = (VB/2)$ and $V_D = (VB/2)$. Thus, when $V_R$ from a conductive half memory cell is differentially compared with $V_C$ or $V_D$ the resulting voltage $V_O$ is represented by $V_O = V_R - V_C$ or $V_O = VB - VB/2$. Significantly, this equation illustrates that the threshold or reference voltage is maintained half way between the signal or logic swing against which it is being compared irrespective of changes in the signals $V_A$ or $V_B$.

Figure 2:
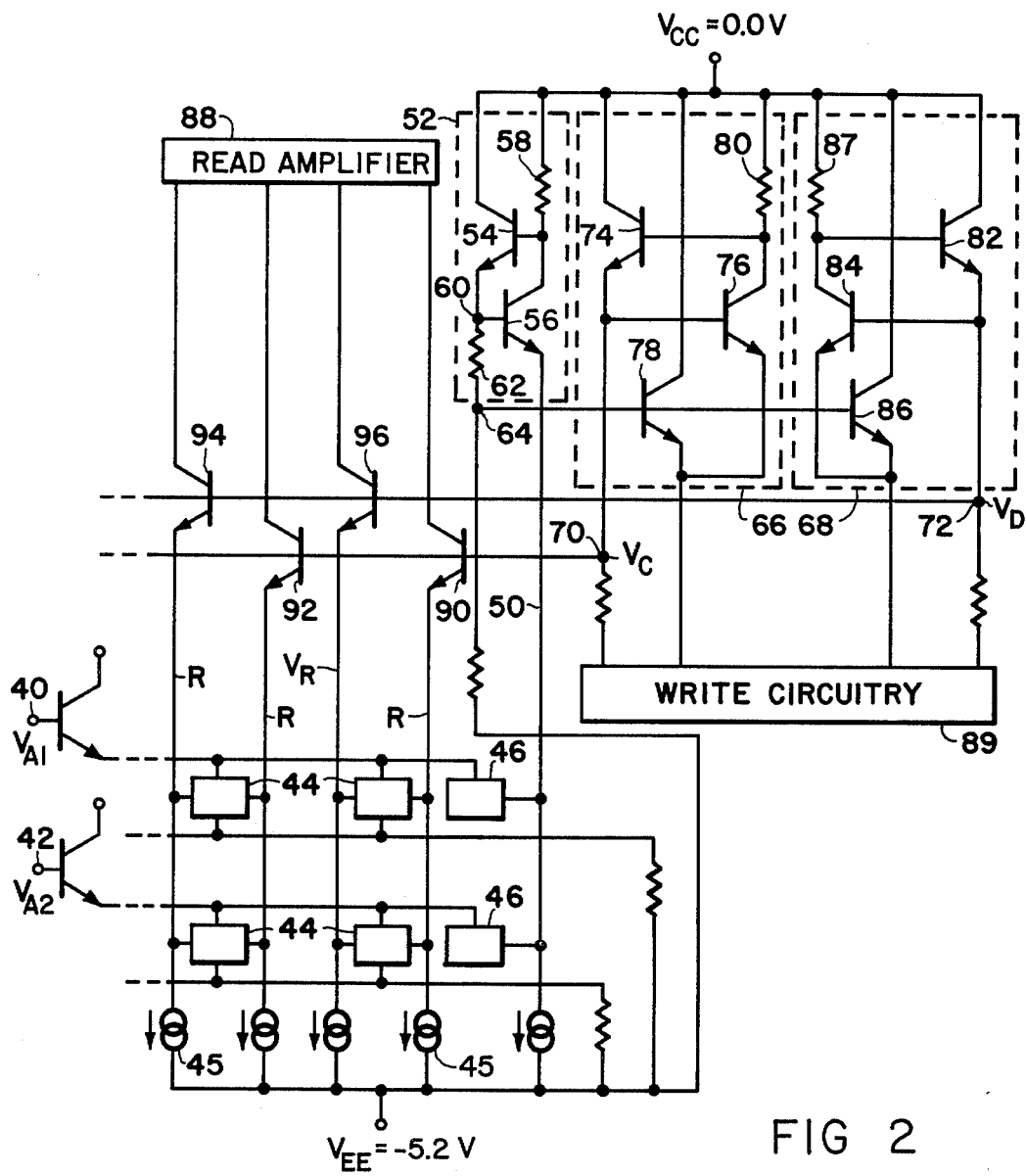

Now referring to FIG. 2, it illustrates in greater detail the present invention. Read input signals $V_{A1}$ and $V_{A2}$ are received at input terminals 40 and 42 which provide a similar function to terminal 16 previously described with respect to FIG. 1. A plurality of identical memory cells 44 are coupled in a conventional manner to current sources generally depicted at 45 and to supply voltage $V_{EE}$ of $-5.2$ volts. Associated with each row of memory cells 44 is a half cell voltage generating circuit shown at 46. The details of memory cell 44 and half cell 46 are described with respect to FIGS. 3 and 4.

Each of the half cell circuits 46 is coupled by line 50 to a unity gain voltage and translating circuit 52. The circuit 52 comprises a pair of transistors 54 and 56. The base of transistor 54 is coupled to supply voltage of $V_{CC}$ equal to 0.0 volts by means of resistor 58. In response to a voltage on line 50 the unity gain portion of circuit 52 develops an identical voltage at node 60 to the voltage at the base of transistor 130 shown in FIG. 4. Resistor 62 translates this voltage down to one-half its value and applies it to node 64. The voltage generated at node 64 corresponds to the voltage $V_B/2$ and constitutes the threshold or reference voltage. The voltage at node 64 is passed through a pair of unity gain amplifiers 66 and 68 in order to develop threshold voltages for the array of memory cells 44 at nodes 70 and 72. The voltages at nodes 70 and 72 again correspond respectively to the voltages shown as $V_C$ and $V_D$ in FIG. 1.

Unity gain amplifier 66 comprises three transistors 74, 76 and 78 and load resistor 80 appropriately connected in a conventional manner. Similarly, unity gain amplifier 68 comprises three transistors 82, 84 and 86 coupled to its load resistor 87. Read amplifier circuitry 88 and write circuitry 89 can take various forms consistent with the operation of the read cycle and do not form part of the present invention.

The threshold voltage $V_C$ is connected to one side of each column of memory cells 44 by means of differential sensing transistors 90 and 92 and similarly the threshold voltage $V_D$ is coupled to the other side of each column of memory cells 44 by means of differential sensing transistors 94 and 96.

Figure 3:
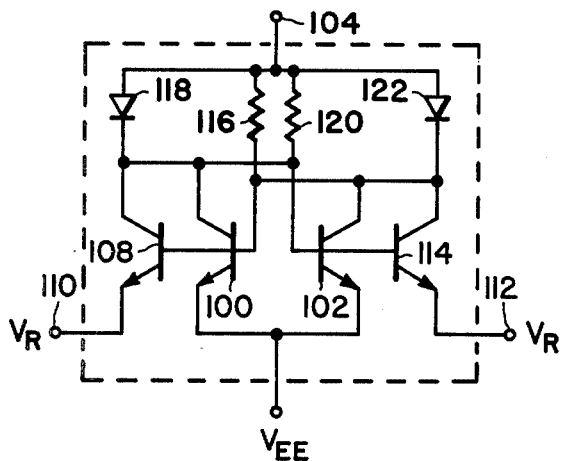
FIGS. 3 and 4 illustrate detailed electrical schematics for the memory cell and the half cell voltage generating circuit generally shown in FIG. 2.

Each of the semiconductor cross-coupled memory cells 44 is of a known configuration and is operative to store either binary 1 or binary 0 in transistors 100 or 102 in a conventional manner as seen in FIG. 3. Assuming that transistor 100 is conductive and transistor 102 is nonconductive and a read signal is applied to terminal 104, read transistor 108 is turned on and a logic level of $V_R$ is generated at output terminal 110. Alternatively and in a similar manner output read voltage $V_R$ can be generated at output terminal 112 via output read transistor 114.

During a read operation and assuming transistor 100 is at or storing a low binary level, i.e., in a conductive state, resistor 116 is coupled between the base of transistor 108 and the read terminal 104 and similarly diode 118 is coupled between the collector of transistor 108 and the read terminal 104. Similarly if transistor 102 is conductive or storing a low or binary O level, then resistor 120 and diode 122 would be similarly interconnected and the output state of transistor 114 would be generated at output terminal 112.

Figure 4:
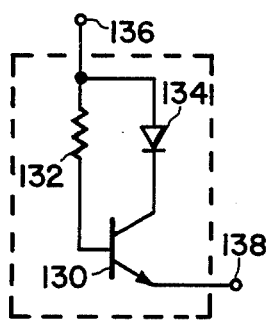

The half cell shown generally at 22 in FIG. 1 and at 46 in FIG. 2 is shown in detail in FIG. 4 and comprises a transistor 130 having its base connected to resistor 132 and its collector to diode 134. As depicted in FIG. 2 terminal 136 is coupled to a read signal and terminal 138 is coupled to the translator circuit shown as 23 in FIG. 1 or as 52 in FIG. 2.

The half cell of FIG. 4 from an electrical and device standpoint is fabricated to conform identically to each of the identical read mode equivalent half cells illustrated in FIG. 3, wherein each of the equivalent half cells is constituted during a read mode by either transistor 108, diode 118, and resistor 116 or transistor 114 diode 122 and resistor 120, as previously discussed.

Figure 5:
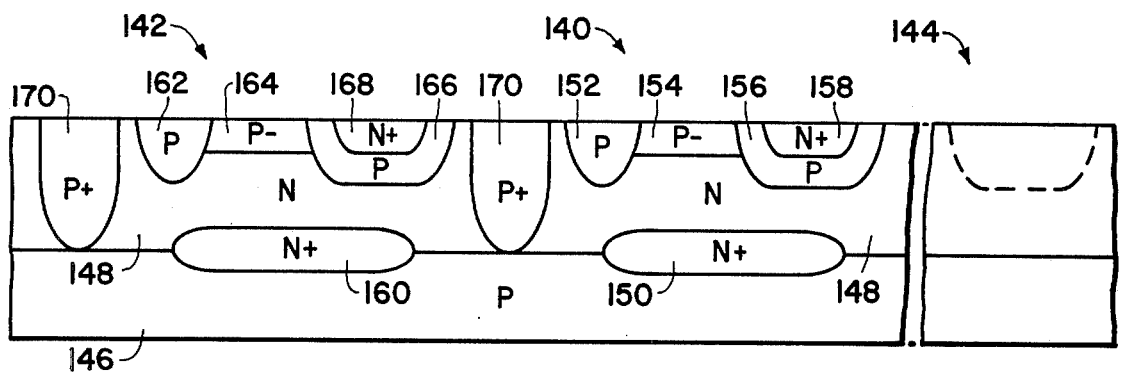
FIG. 5 illustrates in partial cross-secton an integrated circuit implementation of the present invention.

FIG. 5 depicts an integrated circuit substrate showing an equivalent half cell portion (140) of the overall memory cell and a half cell 142 forming a part of the threshold or voltage generating and translating circuit 21, and shown at 22 in FIG. 1. As depicted, circuits or devices 140 and 142 are identical and disposed in close proximity to each other on the substrate. Thus, process induced variations occur in both in a like manner. Accordingly, the overall equivalent impedance of these circuits from an electrical standpoint will tend to vary in equal amounts so as to maintain the generated threshold voltage $V_C$ or $V_D$ exactly midway between the signal swing generated by the memory cell.

For clarity of explanation and simplicity purposes, the remaining portion of the memory cell is not specifically shown in FIG. 5 and it is merely represented schematically by the broken line element 144 to the right of circuit devices 140. Again, the devices of circuit 140 depicts only the output impedance for one-half of the memory cell during a read mode and comprises a transistor, resistor and diode formed on a P substrate 146 and an overlying epitaxial layer 148. Above an N+ buried layer 150 is a P diffused region 152 forming a diode, a P-diffused region 154 forming a resistor, and an NPN transistor having a P-type base region 156 and an N+ emitter region 158.

Identical impedance elements, size, geometry, etc., associated with the voltage generating circuit and also comprising a diode, resistor and transistor are shown at 142 and include an N+ buried layer 160, a P diffused diode region 162, a P-diffused resistor region 164 and an NPN transistor having a P base region 166 and an N+ emitter region 168.

Finally, the devices forming the circuit shown at 142 are isolated by P+ regions 170 as is well known in the art. Although not specifically shown, the memory cell comprising output impedance 140 and the remainder of the memory cell schematically shown at 144 and comprising the additional elements depicted in FIG. 3 is also suitably isolated in a conventional manner.

What is claimed is:

1. An integrated circuit disposed on a substrate comprising: first circuit means being capable of storing a signal and including means for providing the signal state of said first circuit means during a sense mode; and second circuit means to generate a reference signal and being coupled to said first circuit means for supplying the reference signal during the sense mode, the reference signal providing an amplitude reference, said first and second circuit means each having an impedance means, each impedance means being substantially identical during said sense mode.

2. An integrated circuit disposed on a substrate as in claim 1 further including:
   a. terminal means coupled to said first and second circuit means for supplying an enablng signal during the sense mode.

3. An integrated circuit disposed on a substrate as in claim 2 wherein:
   a. said first circuit means comprises a memory cell; and
   b. said second circuit means comprises a threshold voltage generating circuit for said memory cell.

4. An integrated circuit disposed on a substrate as in claim 3 wherein:
   a. said memory cell comprises a cross-coupled semiconductor memory cell, each half of said cross-coupled memory cell being symmetrical with respect to the other half.

5. An integrated circuit disposed on a substrate as in claim 4 wherein:
   a. said impedance means associated with said memory cell comprises a first output impedance means, constituting a portion of one half of said memory cell and a second output impedance means constituting a portion of the other half of said memory cell, and
   b. said impedance means associated with said threshold voltage generating source being disposed on substrate in close proximity to said memory cell, and c. said first output, second output and threshold voltage generating source impedance means being of equal value.

6. An integrated circuit disposed on a substrate as in claim 5 wherein:

a. said first output impedance means, said second output impedance means and said threshold voltage generating impedance means each comprise identical circuit elements.

7. An integrated circuit disposed on a substrate as in claim 6 wherein:

a. said identical circuit elements comprise a transistor, a resistor and a diode.

8. A bipolar memory array having an on-chip voltage source, comprising: a plurality of memory cells arranged in an array; at least one means for generating a reference voltage; and at least a first and a second unity gain circuit for coupling the reference voltage from the at least one means to the array, the first and second unit gain circuits being coupled to selected memory cells, the at least one means having a portion exhibiting an impedance substantially equal to an impedance exhibited by a selected memory cell.

* * * * *